(12) United States Patent
Hunter

(10) Patent No.: US 7,772,696 B2
(45) Date of Patent: Aug. 10, 2010

(54) IC PACKAGE HAVING IC-TO-PCB INTERCONNECTS ON THE TOP AND BOTTOM OF THE PACKAGE SUBSTRATE

(75) Inventor: Matthew A Hunter, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 243 days.

(21) Appl. No.: 11/847,504

(22) Filed: Aug. 30, 2007

(65) Prior Publication Data

US 2009/0057888 A1 Mar. 5, 2009

(51) Int. Cl.
*H01L 23/48* (2006.01)

(52) U.S. Cl. .............. 257/737; 257/E23.031; 438/122

(58) Field of Classification Search ................ 257/686, 257/737, E23.031; 438/122
See application file for complete search history.

(56) References Cited

U.S. PATENT DOCUMENTS

| 7,176,506 | B2 * | 2/2007 | Beroz et al. ............ 257/232 |
| 2005/0280127 | A1 * | 12/2005 | Zhao et al. ............ 257/678 |
| 2006/0157843 | A1 * | 7/2006 | Hwang ............ 257/686 |
| 2006/0220210 | A1 * | 10/2006 | Karnezos et al. ............ 257/686 |

\* cited by examiner

*Primary Examiner*—Sue Purvis
*Assistant Examiner*—Krista Soderholm

(57) ABSTRACT

An integrated circuit package, according to one embodiment, includes a package substrate, an interface stratum and an integrated circuit die. Both the IC die and interface stratum are disposed on the package substrate. The integrated circuit die includes a microelectronic circuit having a plurality of inputs and outputs. A first set of the inputs and outputs are electrically coupled to a plurality of package-to-circuit connection regions on the package substrate. A second set of input and outputs are electrically coupled through the package substrate to package-to-circuit connection regions on the interface stratum.

19 Claims, 8 Drawing Sheets

IC PACKAGE HAVING IC-TO-PCB INTERCONNECTS ON THE TOP AND BOTTOM OF THE PACKAGE SUBSTRATE

BACKGROUND OF THE INVENTION

As microelectronic circuit designs become ever larger, larger integrated circuit packages are also necessary as a result of the extra signal and supply interconnections of the larger microelectronic circuits. Referring to FIG. 1, a printed circuit board assembly, according to the conventional art, is shown. The PCBA 100 typically includes a printed circuit board 110 and a plurality of integrated circuit (IC) packages and one or more discrete electronic components. Conventional IC packages include an integrated circuit (IC) die 120 and a package substrate 130. The IC package may also include an encapsulant 140, thermal dissipation element or combination thereof to provide thermal dissipation, electrical, mechanical, and/or environmental protection. The package substrate 130 is adapted to electrically couple the IC die 120 to a printed circuit board (PCB) 110. In particular, the IC die 120 includes a plurality of connection pads disposed on a first surface. The package substrate 130 includes a plurality of connection pads disposed on a first surface that correspond to the plurality of connection pads on the IC die 120. The connection pads on the first surface of the package substrate 130 are adapted to be electrically coupled to respective connection pads on the IC die 120, typically by reflowing solder bumps 150 on the connection pads of the package substrate 130 and/or IC die 120. The plurality of connection pads on the first side of the package substrate 130 are electrically coupled to a plurality of connection pads on a second side of the package substrate 130 by a plurality of vias. The connection pads on the second side of the package substrate 130 are adapted to be electrically coupled to connection pads on the PCB 110, typically by reflowing solder balls 160 of the package substrate 130 and/or the PCB 110. Alternatively, the substrate 130 may employ connection pins on the second side of the package substrate 130 that mate with plated-through-holes or a socket on the PCB 110.

Conventional pin grid array (PGA) packages typically have a maximum I/O connection density of approximately 600 connections, and ball grid array (BGA) packages have a maximum density of approximately 1000. Chip scale packages, flip-chip packages, and the like typically employ bump grid arrays and can achieve greater connection densities. Typically the connection density is limited by the minimum area of the bond pads and minimum distance between adjacent bond pads. For reliable connection with a PCB, it becomes increasingly more expensive to further miniaturize the area of the bond pads and spacing between the pads. Accordingly, at some point conventional package substrates become unwieldy large due to the large number of connection regions that must be fabricated on the surface that is coupled to the PCB.

SUMMARY OF THE INVENTION

Embodiments of the present technology are directed toward integrated circuit (IC) packages having a high input/output (I/O) density. In one embodiment, the IC package includes a package substrate, an interface stratum and an integrated circuit (IC) die. Both the IC die and interface stratum are disposed on the package substrate. The IC die includes a microelectronic circuit having a plurality of inputs and outputs. A first set of the inputs and outputs are electrically coupled to a plurality of package-to-circuit connection regions on the package substrate. A second set of inputs and outputs are electrically coupled through the package substrate to package-to-circuit connection regions on the interface stratum.

In another embodiment, a printed circuit board assembly (PCBA) includes an IC die, a printed circuit board (PCB), a package substrate and one or more interface stratums. The package substrate includes a first plurality of connection pads disposed upon a first surface of the package substrate and coupled to a plurality of connection pads on the IC die. The package substrate also includes a second plurality of connection pads disposed upon a second surface of the package substrate and coupled to a first set of a plurality of connection pads on the PCB. The package substrate further includes a third plurality of connection pads disposed upon the first surface of the package substrate. Each interface stratum includes a first plurality of connection pads coupled to the third plurality of pads on the package substrate. Each interface stratum also includes a second plurality of connection pads coupled to a second set of the plurality of connection pads disposed on the PCB.

In yet another embodiment, a method of fabricating an IC package includes electrically and mechanically coupling a plurality of pads on an IC die to corresponding pads on a first surface of a package substrate. The method further includes electrically coupling a plurality of pads on an interface stratum to corresponding pads on the first surface of the package substrate.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
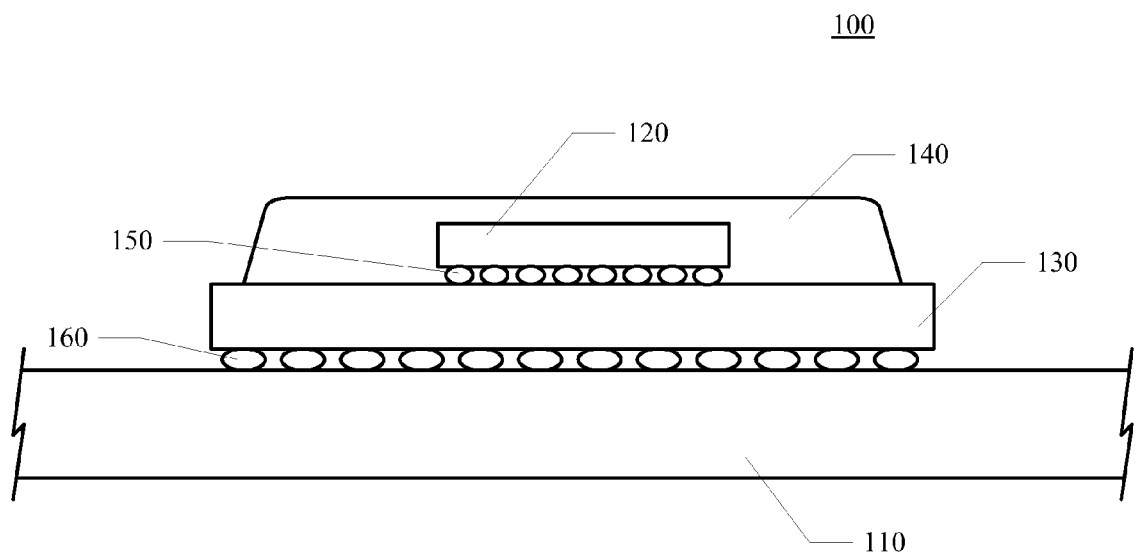
FIG. 1 shows a cross-sectional view of a printed circuit board assembly, according to the conventional art.
Figure 2:
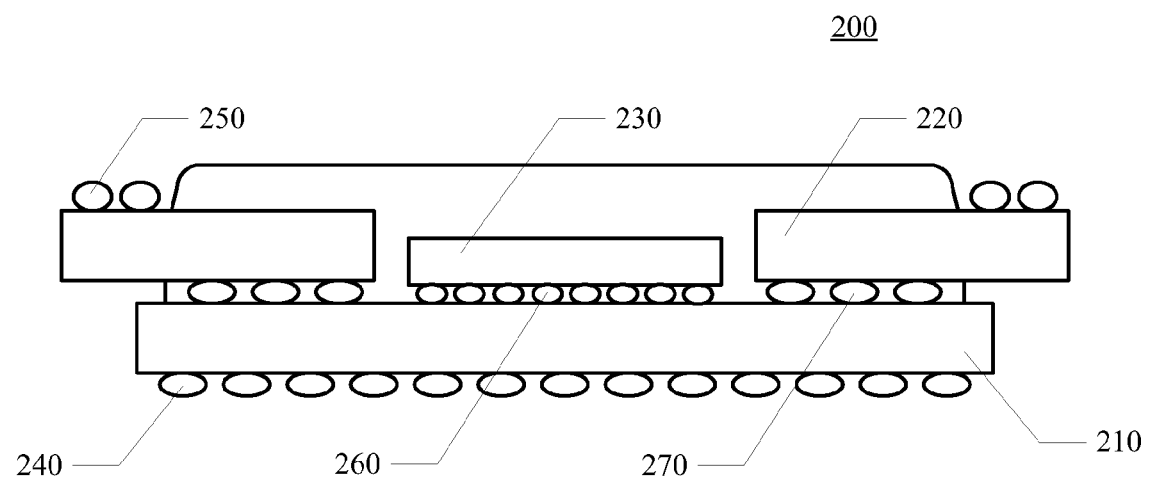
FIG. 2 shows a cross-sectional view of an integrated circuit package, in accordance with one embodiment of the present technology.

Referring to FIG. 2, an integrated circuit (IC) package, in accordance with one embodiment of the present technology, is shown. The IC package 200 includes a package substrate 210, one or more interface stratums 220 and an integrated circuit (IC) die 230. The IC die 230 and one or more interface stratums 220 are disposed on the same surface of the package substrate 210. The IC die 230 includes a microelectronic circuit having a plurality of inputs and outputs. The microelectronic circuit may be a graphic processor (GPU), a chip set or one or more microelectronic circuits of the chip set such as a north bridge and/or south bridge, a central processor (CPU), digital signal processor (DSP), memory, application specific integrated circuit (ASIC) or the like.

The microelectronic circuit may include hundreds or thousands of inputs and outputs. The input and output connections are for receiving and/or outputting a plurality of signals and one or more supply potentials. The signals may be analog and/or digital signals. The supply potential may be one or more positive power supplies, negative supplies and/or ground.

A first set of the inputs and outputs of the IC die 230 are electrically coupled to a plurality of package-to-circuit connection regions 240 on the package substrate 210. A second set of the inputs and output of the IC die 230 are electrically coupled through the package substrate 210 to package-to-circuit connection regions 250 on the interface stratum 220.

Figure 3A:
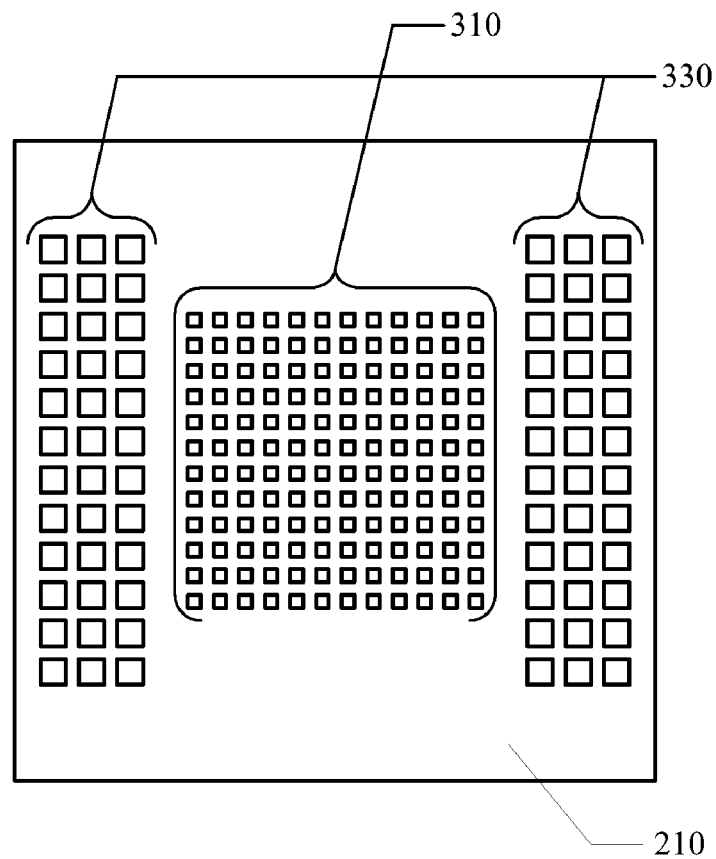
FIG. 3A shows a top view of a package substrate, in accordance with one embodiment of the present technology.

More specifically, the IC die 230 includes a plurality of connection pads on a first surface. The package substrate includes a first plurality of connection pads 310 disposed on a first surface of the package substrate, as illustrated in FIG. 3A. The plurality of connection pads on the IC die 230 correspond with the first plurality of connection pads 310 disposed on the first surface of the package substrate 210. Each of the corresponding connection pads on the package substrate 210 and IC die 220 are electrically and mechanically coupled together. In one implementation, the corresponding connection pads on the package substrate 210 and IC die 220 are electrically and mechanically coupled together by respective solder bumps 260, or the like, as illustrated in FIG. 2.

Figure 3B:
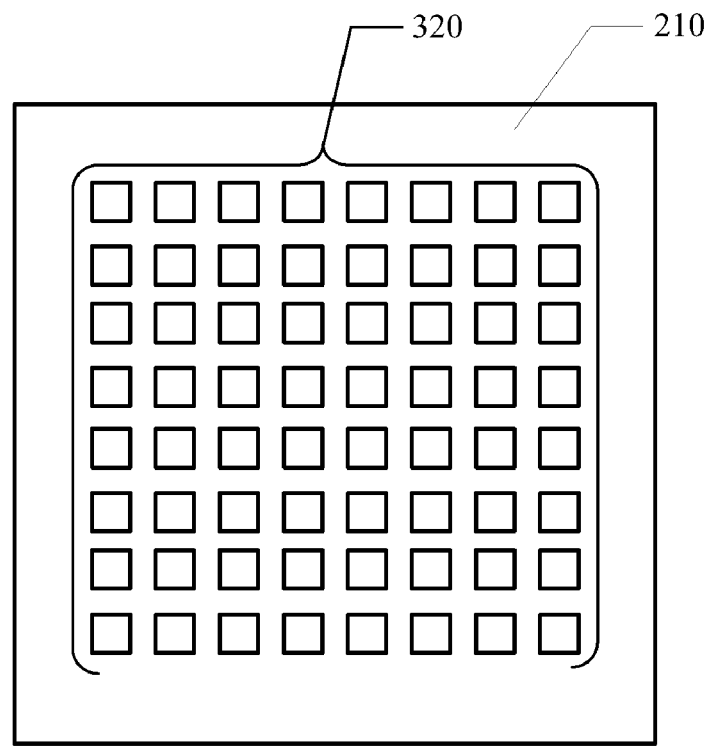
FIG. 3B shows a bottom view of a package substrate, in accordance with one embodiment of the present technology.

The package substrate 210 also includes a second plurality of connection pads 320 disposed on a second surface of the package substrate 210, as illustrated in FIG. 3B. The second plurality of connection pads 320 on the package substrate 210 are adapted to be electrically and mechanically coupled to corresponding connection pads on a printed circuit board (PCB). In one implementation, the corresponding connection pads on the package substrate 210 may be electrically and mechanically coupled to the PCB by respective solder balls 240, as illustrated in FIG. 2.

The package substrate 210 also includes a third plurality of connection pads 330 disposed on the first surface of the package substrate 210, as illustrated in FIG. 3A. If the IC package 200 includes a single interface stratum 220, the interface stratum includes a plurality of connection pads that correspond with the third plurality of connection pads 330 disposed on the first surface of the package substrate 210. Each of the corresponding connection pads 330 on the interface stratum 220 and package substrate 210 are electrically coupled together. If the IC package 200 includes a plurality of interface stratums 220, each interface stratum includes a plurality of connection pads that corresponding with a respective set of the third plurality of connection pads 330 disposed on the first surface of the package substrate 210. Each of the respective corresponding connection pads on the interface stratums 220 and package substrate 210 are electrically coupled together. In one implementation, the corresponding connection pads on the one or more interface stratums 220 and package substrate 210 may be electrically couple by respective solder balls 270. The interface stratum 220 also includes additional connection pads or other connection means that are adapted to be electrically coupled to corresponding connection pads on the (PCB). In one implementation, the additional connection pads on the one or more stratums 220 may be electrically coupled to corresponding connection pads on the PCB by respective solder bumps 250, as illustrated in FIG. 2.

A first plurality of vias electrically couple a first set of the first plurality of connection pads on the first surface of the package substrate to the second plurality of connection pads disposed on the second side of the package substrate. A second plurality of vias electrically couple a second set of the first plurality of connection pads on the first side of the package substrate to the third plurality of connection pads disposed on the second side of the package substrate. One or more patterned conductive layers in the package substrate form the vias and connection pads. The conductive layers may be formed on and/or separated by one or more insulative layer, such as a glass-epoxy, intrinsic semiconductor or the like. The package substrate may generally be fabricated using the same technologies as used to fabricated conventional printed circuit boards but with smaller minimum feature sizes than used for conventional printed circuit board assemblies. Alternatively, the package substrate may be fabricated using the same technologies as used to fabricate convention IC die but with larger minimum feature sizes than used for conventional microelectronic circuits.

Similarly, a plurality of vias electrically couple the first plurality of connection pads on the interface stratum to the second plurality of connection pads on the interface stratum. The interface stratum may be substantially the same as the package substrate, may be a flex-circuit, may be a micro-coax, may be a lead frame, or the like. In addition, the interface stratum may include a combination of two or more of the following elements: a daughter substrate portion, a flex-circuit portion, a micro-coax portion, a wire frame portion, a wirebond portion, wire portions, a microconnector portion, and other similar elements.

Figure 4:
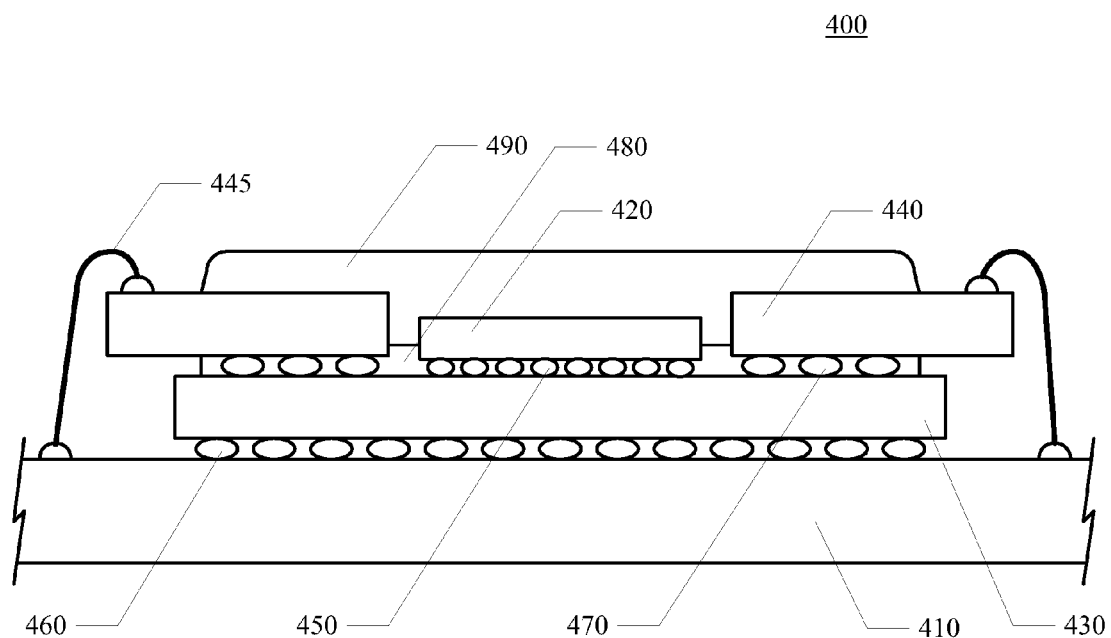
FIG. 4 shows a cross-sectional view of a printed circuit board assembly, in accordance with one embodiment of the present technology.

Referring now to FIG. 4, a printed circuit board assembly (PCBA), in accordance with one embodiment of the present technology, is shown. The PCBA 400 includes a printed circuit board (PCB) 410, a plurality of integrated circuits (IC) packages and one or more discrete electronic components. One or more of the IC packages include an IC die 420, a package substrate 430 and one or more interface stratums 440, 445. The package substrate 430 includes a first plurality of connection pads disposed upon a first surface of the package substrate 430 and coupled to a plurality of connection pads on the IC die 420. Typically, the IC die 420 will have hundreds or thousands of connection pads that couple to corresponding connection pads on the package substrate 430. The connection pads on the first surface of the package substrate 430 are adapted to be electrically coupled to respective connection pads on the IC die 420, typically by reflowing solder bumps 450 on the connection pads of the package substrate 430 and/or IC die 420.

The package substrate 430 also includes a second plurality of connection pads disposed upon a second surface of the package substrate 430 and coupled to a first set of a plurality of connection pads on the PCB 410. The connection pads on the second surface of the package substrate 430 are adapted to be electrically and mechanically coupled to connection pads on the PCB 410, typically by reflowing solder balls 460 on the connection pads of the package substrate 430 and/or the PCB 410. Alternatively, the substrate 430 may employ connection pins on the second surface of the package substrate 430 that mate with plated-through-holes or a socket on the PCB 410.

The package substrate 430 further includes a third plurality of connection pads disposed upon the first surface of the package substrate 430. As illustrated in FIG. 4, the interface stratum 440, 445 in one embodiment may include one or more daughter substrates 440 and a plurality of wire bondings 445. Each daughter substrate 440 includes a first plurality of connection pads coupled to the third plurality of pads on the package substrate 430. The third plurality of connection pads on the first surface of the package substrate 430 are adapted to be electrically and mechanically coupled to the first plurality of connection pads on the one or more daughter substrates 440, typically by reflowing solder balls 470 on the connection pads of the package substrate 430 and/or the daughter substrates 440. Each daughter substrate 440 also includes a second plurality of connection pads. The wire bonds 445 couples a respective one of the second plurality of connection pads on the daughter substrate 440 to a corresponding one of the second set of the plurality of connection pads disposed on the PCB 410.

The IC package may also include under fill 480 and/or an encapsulant (e.g., die cap) adapted to provide mechanical coupling and/or protection, thermal coupling, and/or environmental protection. The IC package may also include a heat spreader, heat slug, heat sink or other passive or active thermal components. In addition, the IC package or a portion thereof, such as the encapsulant and/or heat spreader, may be adapted to be coupled to a fan, refrigeration component, thermoelectronic component or the like.

Figure 5:
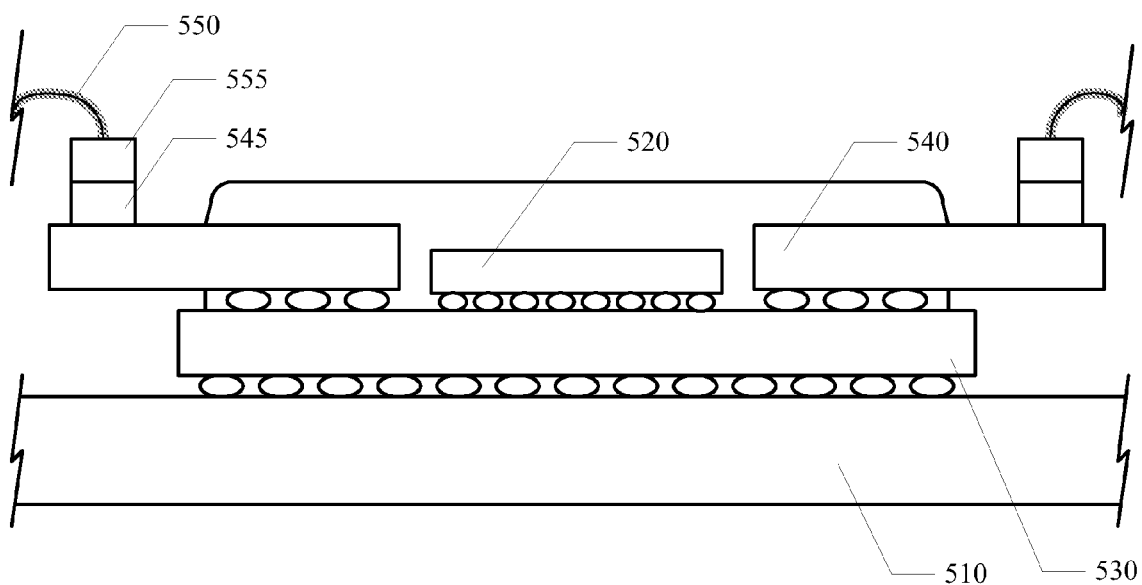
FIG. 5 shows a cross-sectional view of a printed circuit board assembly, in accordance with another embodiment of the present technology.

Referring now to FIG. 5, a printed circuit board assembly (PCBA), in accordance with another embodiment of the present technology, is shown. The PCBA 400 includes a printed circuit board (PCB) 510, a plurality of integrated circuits (IC) packages and one or more discrete electronic components. One or more of the IC packages include an IC die 520, a package substrate 530 and one or more interface stratums 540, 545. The interface stratums 540, 545 may include one or more daughter substrates 540 and one or more microconnectors 545. A flex-circuit 550 with a mating microconnector 555 may couple the microconnector 545 on the daughter substrate 540 to the second plurality of connection pads on the PCB 510.

Figure 6:
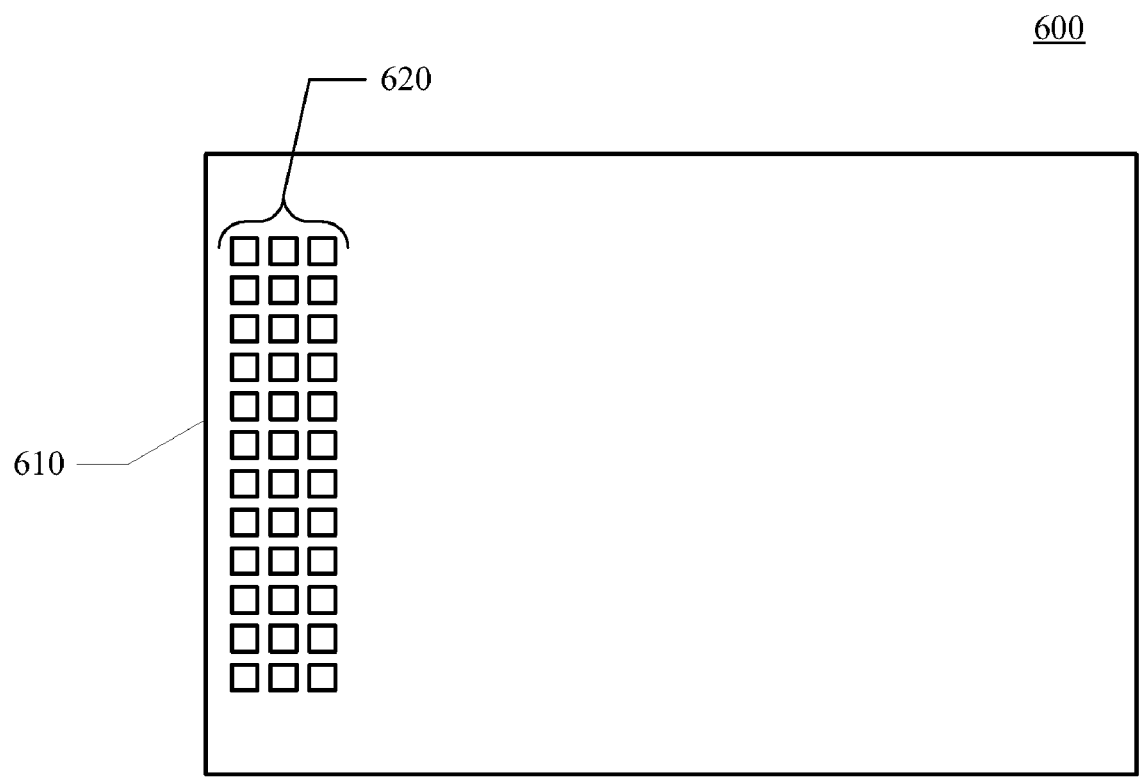
FIG. 6 shows a bottom view of an interface stratum, in accordance with one embodiment of the present technology.
Figure 7:
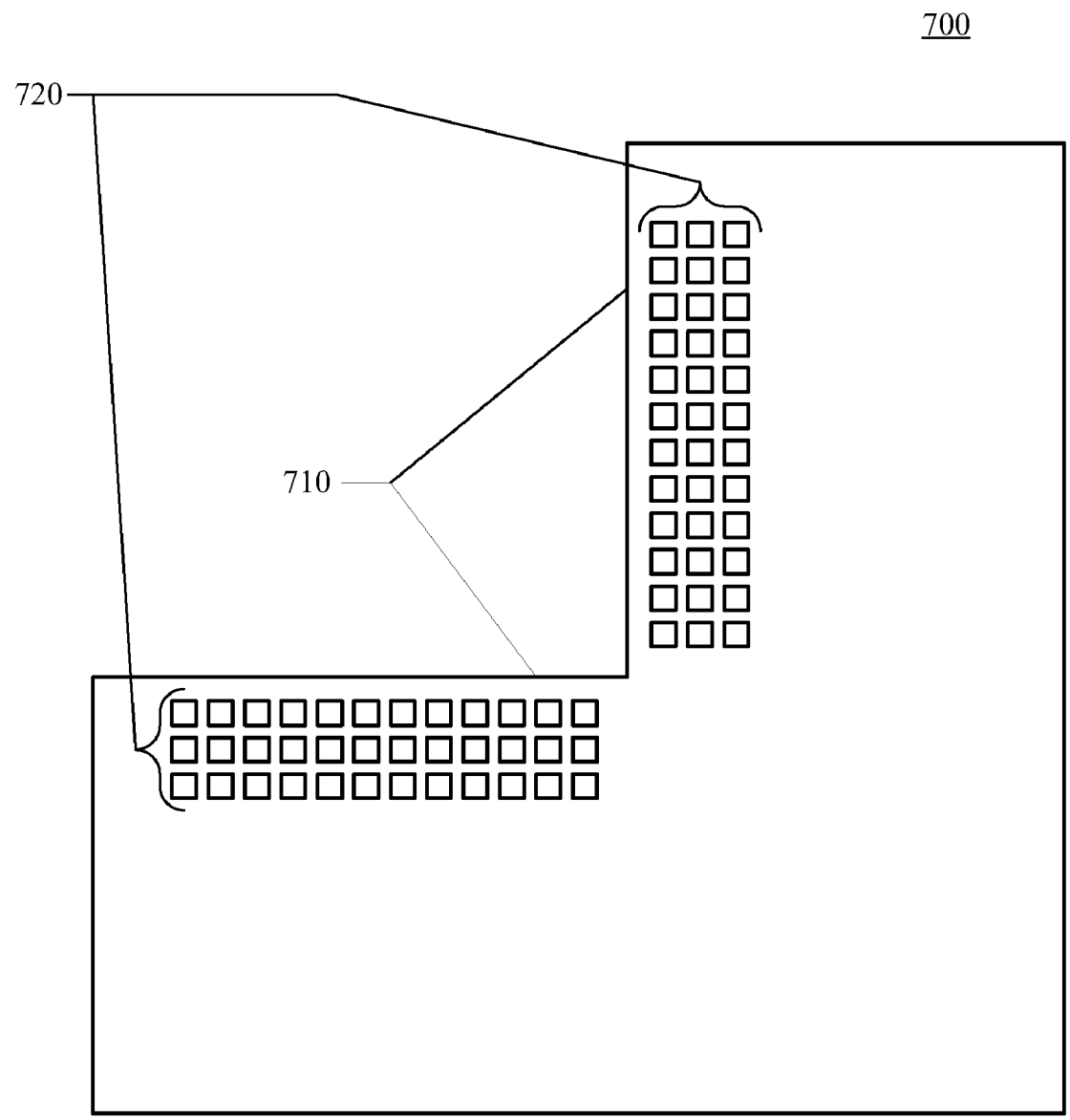
FIG. 7 shows a bottom view of an interface stratum, in accordance with another embodiment of the present technology.
Figure 8:
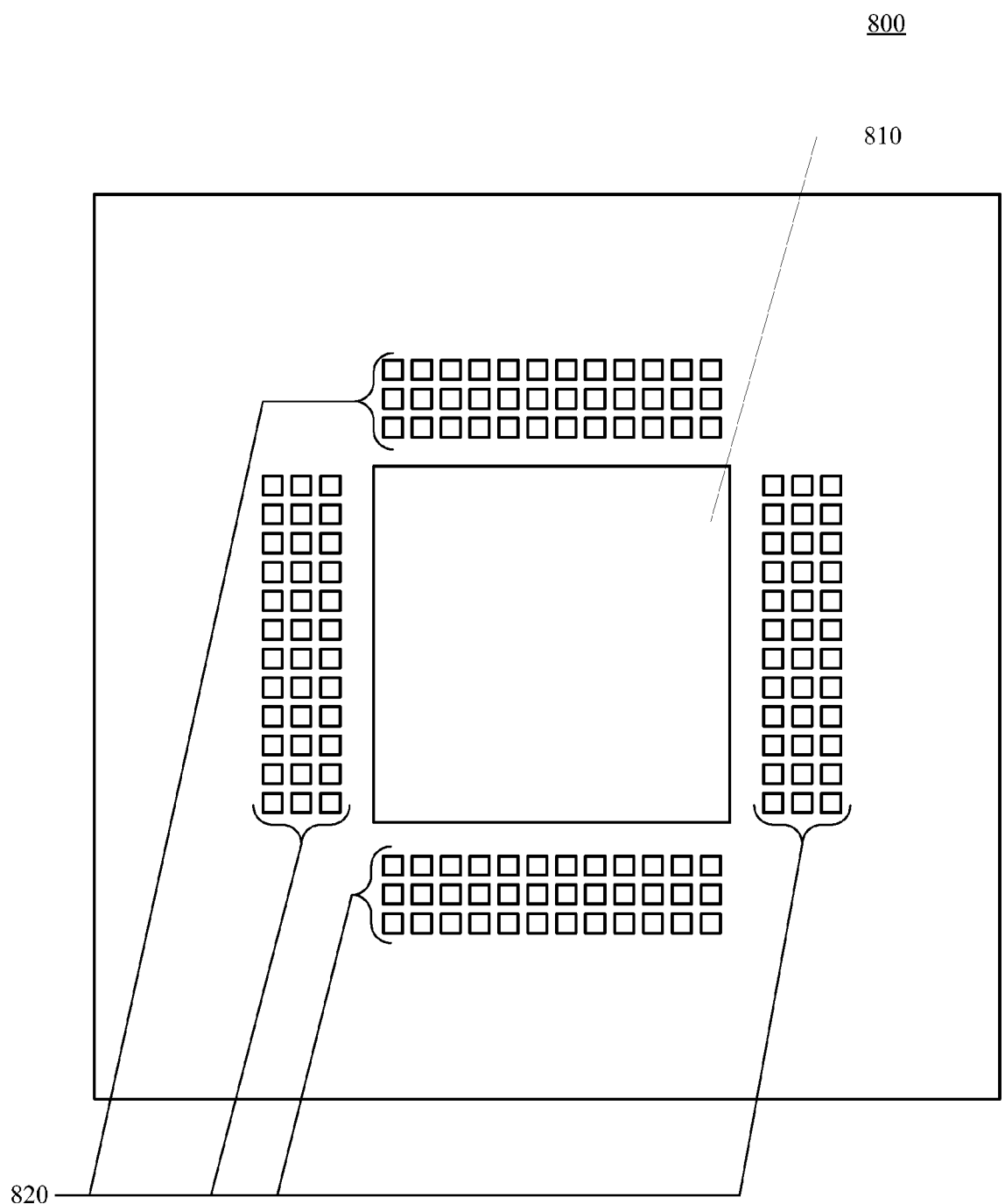
FIG. 8 shows a bottom view of an interface stratum, in accordance with yet another embodiment of the present technology.

In one implementation, the interface stratum 600 includes a plurality of contact pads 610 disposed along an edge 620 of the interface stratums 600, as illustrated in FIG. 6. In such an implementation, the interface stratum 600 may be adapted to be disposed on a package substrate along a respective edge of the substrate. In another implementation, an interface stratum 700 may include an edge cut-away 710 and a plurality of contact pads 720 disposed along the edge cut-away 710, as illustrated in FIG. 7. In such an implementation, the interface stratum 700 may be adapted to be disposed on a package substrate along two or three edges of the substrate. An interface stratum 700 with an edge cut-away may be used in combination with another interface stratum 700 with an edge cut-away or with one or more interface stratums 600 without edge cut-aways. In yet another implementation, an interface stratum 800 may include a cut-out 810 and a plurality of contact pads 820 disposed along the edge cut-out 810, as illustrated in FIG. 8. In such an implementation, the interface stratum 800 may be adapted to be disposed on a package substrate along all four edges of the substrate. Generally, all of the interface stratums are adapted to be electrically couple with the IC die through the package substrate without interfering with a heat dissipation device coupled to the IC device. In addition, one or more interface stratums may include other cut-aways and/or cut-outs to allow other components to be coupled to the package substrate.

In accordance with embodiments of the present technology, the package substrate and the one or more interface stratums are adapted to electrically couple the IC die to a printed circuit board. Typically, the IC die will have hundreds or thousands of connections. Embodiments of the present technology advantageously provide additional interconnects for the same size package substrate, as compared to the conventional art. The additional interconnects may be utilized to meet the requirement of high current devices by providing additional interconnects, multiple path interconnects, interconnects with larger cross sectional area, or the like. The interconnects to the PCB from the both surfaces of the package substrate may also be utilized to increase spatial separation between the interconnects. Increasing the spatial separation may advantageously reduce signal integrity issues. For example, cross coupling noise and the like may be decreased as a result of the increased spatial separation between one or more interconnect to the PCB.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An integrated circuit package comprising:
   a package substrate;
   an interface stratum disposed on the package substrate; and
   an integrated circuit die disposed on the package substrate and including a microelectronic circuit having a plurality of inputs and outputs, wherein a first set of the inputs and outputs on a first surface of the integrated circuit die are electrically coupled through a first and second surface of the package substrate to a plurality of package-to-circuit connection regions on the second surface of the package substrate and a second set of input and outputs on the first surface of the integrated circuit die are electrically coupled through the first surface of the package substrate to package-to-circuit connection regions on the interface stratum.

2. The integrated circuit package of claim 1, further comprising a heat dissipation element coupled to the integrated circuit die.

3. The integrated circuit package of claim 1, further comprising an under fill disposed between the package substrate and the integrated circuit die and between the package substrate and the interface stratum.

4. The integrated circuit package of claim 1, wherein the interface stratum includes a edge-cut away that is disposed on the package substrate along two or three edges of the package substrate.

5. The integrated circuit package of claim 1, wherein the interface stratum includes a cut-out that is disposed on the package substrate along all four edges of the package substrate.

6. A printed circuit board assembly (PCBA) comprising:
   an integrated circuit (IC) die including a plurality of connection pads;
   a printed circuit board (PCB) including a plurality of connection pads;
   a package substrate including; and
      a first plurality of connection pads disposed upon a first surface of the package substrate and coupled to the plurality of connection pads on the integrated circuit die;
      a second plurality of connection pads disposed upon a second surface of the package substrate and coupled to a first set of the plurality of connection pads on the printed circuit board; and
      a third plurality of connection pads disposed upon the first surface of the package substrate;
   one or more interface stratums, wherein each interface stratum includes;
      a first plurality of connection pads coupled to the second plurality of pads on the package substrate; and
      a second plurality of connection pads coupled to a second set of the plurality of connection pads disposed on the printed circuit board; and
   wherein the integrated circuit die and the one or more interface stratums are disposed on the package substrate, and the one or more interface stratums are not disposed on the integrated circuit die.

7. The printed circuit board assembly of claim 6, further comprising a die cap coupling the IC die to the IC package substrate.

8. The printed circuit board assembly of claim 7, wherein the die cap comprises a heat spreader.

9. The printed circuit board assembly of claim 7, wherein the die cap comprises a stiffener.

10. The printed circuit board assembly of claim 6, wherein the interface stratum comprises an additional PCB.

11. The printed circuit board assembly of claim 6, wherein the interface stratum comprises one or more wires.

12. The printed circuit board assembly of claim 6, wherein the interface stratum comprises a daughter substrate.

13. The printed circuit board assembly of claim 6, wherein the interface stratum comprises a lead frame.

14. The printed circuit board assembly of claim 6, wherein the interface stratum comprises a flex-circuit.

15. The printed circuit board assembly of claim 6, wherein the package substrate further includes:
   a first plurality of vias electrically coupling a first set of the first plurality of connection pads on the first surface of the package substrate to the second plurality of connection pads disposed on the second surface of the package substrate; and
   a second plurality of vias electrically coupling a second set of the first plurality of connection pads on the first surface of the package substrate to the third plurality of connection pads disposed on the first surface the package substrate.

16. The printed circuit board assembly of claim 6, wherein each interface stratum includes a plurality of vias coupling the first plurality of connection pads on the interface stratum to the second plurality of connection pads on the interface stratum.

17. A method comprising:
   electrically and mechanically coupling a plurality of pads on an IC die to corresponding pads on a first surface of a package substrate;
   electrically coupling a plurality of pads on an interface stratum to corresponding pads on the first surface of the package substrate; and
   electrically and mechanically coupling a plurality of pad on a second surface of the package substrate to corresponding pads on a printed circuit board; and
   electrically coupling a second plurality of pads on the interface stratum to correspond pads on the printed circuit board.

18. The method according to claim 17, encapsulating the IC die, the first surface of the package substrate and a portion of the interface stratum.

19. The method according to claim 17, further comprising under filling between the package substrate and the IC die, and between the package substrate and the interface stratum.

* * * * *